(12) United States Patent
Van Driest

(10) Patent No.: US 9,166,602 B2
(45) Date of Patent: Oct. 20, 2015

(54) TRANSCEIVER

(75) Inventor: Hans Van Driest, Den Haag (NL)

(73) Assignee: GREENPEAK TECHNOLOGIES B.V., Utrecht (NL)

(*) Notice: Subject to any disclaimer, the term of this patent is extended or adjusted under 35 U.S.C. 154(b) by 422 days.

(21) Appl. No.: 13/636,350

(22) PCT Filed: Mar. 24, 2010

(86) PCT No.: PCT/NL2010/050150
§ 371 (c)(1),
(2), (4) Date: Sep. 21, 2012

(87) PCT Pub. No.: WO2011/199022
PCT Pub. Date: Sep. 29, 2011

(65) Prior Publication Data
US 2013/0005276 A1    Jan. 3, 2013

(51) Int. Cl.
*H04B 1/40* (2015.01)
*H03L 7/06* (2006.01)
*H03L 7/091* (2006.01)

(52) U.S. Cl.
CPC . *H03L 7/06* (2013.01); *H03L 7/091* (2013.01)

(58) Field of Classification Search
USPC ............ 455/76, 165.1, 183.1, 260; 331/16, 1
See application file for complete search history.

(56) References Cited

U.S. PATENT DOCUMENTS

| | | | | |
|---|---|---|---|---|
| 3,543,172 | A * | 11/1970 | Seppeler | 329/301 |
| 5,343,169 | A * | 8/1994 | Debaty | 331/17 |
| 5,995,539 | A * | 11/1999 | Miller | 375/222 |
| 5,999,561 | A * | 12/1999 | Naden et al. | 375/142 |
| 6,614,866 | B2 | 9/2003 | Hafez et al. | |
| 7,279,988 | B1 * | 10/2007 | Janesch et al. | 331/10 |
| 7,411,461 | B2 | 8/2008 | Siddall | |
| 7,750,685 | B1 * | 7/2010 | Bunch et al. | 327/48 |
| 2005/0057387 | A1 * | 3/2005 | Janakiraman et al. | 341/156 |
| 2006/0209986 | A1 * | 9/2006 | Jensen et al. | 375/302 |
| 2006/0223454 | A1 * | 10/2006 | Westwick et al. | 455/76 |
| 2007/0035345 | A1 * | 2/2007 | Siddall | 331/16 |
| 2007/0213019 | A1 * | 9/2007 | Devries et al. | 455/130 |
| 2009/0296855 | A1 * | 12/2009 | Kitamura et al. | 375/297 |
| 2011/0109321 | A1 * | 5/2011 | Kawabata et al. | 324/555 |

FOREIGN PATENT DOCUMENTS

WO   WO 2004075501 A1 *  9/2004  ............ H04L 27/156

OTHER PUBLICATIONS

International Search Report dated Dec. 17, 2010, corresponding to PCT/NL2010/050150.

* cited by examiner

*Primary Examiner* — Edward Urban
*Assistant Examiner* — Ralph H Justus
(74) *Attorney, Agent, or Firm* — Young & Thompson

(57) ABSTRACT

A transceiver 1 includes a frequency synthesizer 2 configured to generate an output signal 3 for use as a carrier signal for transmission and/or a signal with a channel frequency for reception, wherein the frequency synthesizer is a sub-sampling based frequency locked loop frequency synthesizer. The combination of a FLL and sub-sampling allows to obtain a sub-sample based locked loop with a closed loop response similar to a PLL but with improved settling time and improved suppression of high frequency components of the quantization noise due to the sampling process. The transceiver allows to obtain a frequency synthesizer with improved characteristics with respect to at least one of power consumption, locking characteristic, design optimization characteristics compared to non-sub-sampling PLL based frequency synthesizers.

19 Claims, 4 Drawing Sheets

TRANSCEIVER

TECHNICAL FIELD OF THE INVENTION

The invention relates to a transceiver, more particular to a transceiver with low power consumption, more particular to an IEEE 802.15.4 transceiver. The invention further relates to frequency synthesizer for use in a transceiver, more particular a frequency synthesizer with low power consumption, more particular to a frequency synthesizer for use in a IEEE 802.15.4 transceiver.

BACKGROUND OF THE INVENTION

Frequency synthesizers utilized in known radio frequency (RF) communication devices, such as a RF transmitter, have included a voltage controlled oscillator and a reference oscillator coupled together in a phase locked loop. A voltage-controlled oscillator or VCO is an electronic oscillator designed to be controlled in oscillation frequency by a voltage supplied to a control input. The frequency of oscillation $f_{VCO}$ depends on the applied DC voltage. The VCO frequency is divided by a 1/N divider to a frequency comparable to a reference frequency $f_{ref}$. A phase detector PD compares the phase of the reference frequency with the phase of the divided VCO frequency out of the 1/N divider. A phase difference will result in a phase error signal on the output of the phase detector. Usually this error signal is either a positive or negative current pulse with a duration equal to the difference in phase, wherein the direction of the current depends on the direction of the error. The translation of the phase error into a current is performed inside the phase detector PD. This translation is done with a charge pump, named so as to indicate that charge is pumped into the loop filter. The loop filter low-pass filters the current representing the phase error so as to obtain an averaged phase error which is fed back to the control input of the VCO. The loop is a negative feedback loop. If the VCO frequency drifts, the error signal will increase/decrease driving the VCO frequency in the opposite direction so as to reduce the error. Thus, the VCO output is locked to the reference frequency at the other input of the phase detector PD.

Practical design aspects concern the amount of time the frequency synthesizer can switch from channel to channel, time to lock when first switched on, and how much noise there is in the VCO output. All of these are a function of the loop filter of the system, which usually is a low-pass filter placed between the output of the phase comparator and the input of the VCO. Usually the output of a phase comparator is in the form of short error pulses, but the input of the VCO must be a smooth noise-free DC voltage. Any noise on this signal naturally causes frequency modulation of the VCO. Heavy filtering will make the VCO slow to respond to changes, causing drift and slow response time, but light filtering will produce noise and other problems with harmonics. Thus, the design of the filter is critical to the performance of the system. U.S. Pat. No. 6,614,869B2 discloses a PLL-based frequency synthesizer. The output of the VCO is sampled with a sampling frequency which is substantially less than the frequency of the VCO signal. However, sampling introduces quantization and phase noise in the loop which is still found at the input of the VCO resulting in a VCO output signal with a frequency which generally is not stable enough for use in transceivers.

U.S. Pat. No. 7,279,988B1 discloses a digital frequency locked loop and phase locked loop frequency synthesizer. In a first state, the frequency and phase locked loop operates in the frequency locked loop (FLL) mode for initial frequency acquisition. Once the frequency and phase locked loop has locked in FLL mode, the frequency and phase locked loop transitions to the phase locked loop (PLL) mode for normal operation. The synthesizer includes a Digitally Controlled Oscillator (DCO) and a $2^M$ counter which operates at the output frequency of the DCO. These components are rather power-consuming.

It is commonly known that sub-sampling enables to reduce the power consumption but it introduces quantization noise. When sub-sampling is used in a PLL, this quantization noise feeds through the phase frequency detector (PFD), is filtered by the loop filter and then presented at the control input of the VCO. The signal generated by the VCO will have a noisy frequency as it includes the quantization noise. In most cases, the loop filter of a PLL has an out-of-band attenuation with a roll-off of 6 dB per octave. In order to fulfill stability criteria, a PLL allows limited filtering, the filtering is part of the loop and the loop filter of a PLL can, in most cases, for higher frequencies, be considered as a first order filter. The quantization noise at the input can be reduced by decreasing the loop-bandwidth. However, this will increase the settling time of the transceiver.

Frequency synthesizers can also be built using a Frequency Locked Loop (FLL). Generally, this is not done, mostly because there are noise disadvantages for example with respect to the in-band phase noise. The characteristics of a PLL for use in a transceiver are regarded to be superior over the characteristics of a FLL. Practical aspects of a frequency synthesizer concern the amount of time during which the system can switch from channel to channel, time to lock when first switched on, and how much noise there is in the output. All of these are influenced by the loop filter of the system, which is a low-pass filter placed between the output of the frequency comparator and the input of the VCO. Usually the output of a frequency comparator is in the form of short error pulses, but the input of the VCO must be a smooth noise-free DC voltage. (Any noise on this signal naturally causes frequency modulation of the VCO.).

A filter with a lower cut-off frequency will make the VCO slower to respond on changes and will give it less control over low frequency phase noise out produced inside the VCO, but a higher cut-off frequency will let pass more noise out of the phase or frequency comparator. Thus, the design of the filter is critical for the performance of the system.

SUMMARY OF THE INVENTION

The object of the invention is to provide an improved transceiver, with respect to at least one of power consumption, locking characteristic, loop-bandwidth, design optimization characteristics.

According to the invention, this object is achieved by a transceiver having the features of Claim 1. Advantageous embodiments and further ways of carrying out the invention may be attained by the measure mentioned in the dependent claims.

According to the invention, a transceiver comprises a frequency synthesizer configured to generate an output signal for use as a carrier signal for transmission and/or a signal with a channel frequency for reception, wherein the frequency synthesizer is a sub-sampling based frequency locked loop frequency synthesizer.

The present invention is based on the recognition that a frequency locked loop allows better suppression of out-of-band frequency components generated inside the control loop. The loop filter can be a $2^{nd}$ order loop filter with an out-of-band attenuation with a roll-off of 12 dB per octave, whereas the loop filter of most PLL's have an out-of-band attenuation with a roll-off of 6 dB per octave. The better attenuation of out-of-band frequencies allows us to sub-sample the output signal of the VCO while a similar loop bandwidth and comparable out-of-band noise is possible compared to a PLL without sub-sampling. By using the combination of sub-sampling and an FLL, the power consumption could be reduced significantly without loosing loop bandwidth and thus without reducing the loop bandwidth and the settling time of the transceiver. With an FLL a closed loop low-pass response could be obtained which differs only slightly in the transition from in-band to out-of-band frequencies but which suppresses much better high frequency components of the quantization noise caused by the sampler.

According to an embodiment of the invention, the frequency locked loop frequency synthesizer comprises:

a frequency detector unit configured to receive a reference frequency signal $f_{ref}$ and a variable frequency signal and to generate a frequency difference output signal, the difference output signal being a function of a difference between a frequency value associated with the reference frequency signal $f_{ref}$ and a frequency value associated with the variable frequency signal;

a digital-to-analog convertor configured to convert the frequency difference output signal in to an analog frequency difference signal;

an analog loop filter unit configured to receive the analog frequency difference output signal and configured to attenuate any signal component above a predetermined frequency to provide a smoothed control signal;

a voltage controlled oscillator unit configured to receive the smoothed control signal and to produce an output signal whose frequency is a function of the smoothed control signal; and a sampling unit configured to under-sample the output signal with a predetermine sampling frequency $f_{sampling}$ to obtain the variable frequency signal that is applied to the frequency detector unit, wherein the variable frequency signal is a P-bit digital signal, where P<8.

Using an analog loop filter and voltage controlled oscillator enables to use standard components with known characteristics and which are inexpensive and dissipate less power than a digital loop filter and a DCO. In an embodiment P=1. In this embodiment a binary sampler is used, which enables us to reduce the power consumption further.

In an embodiment of the invention, the reference frequency signal is an adjustable constant M-bit value, wherein the constant M-bit value determines the average frequency of the output signal of the frequency synthesizer, and wherein the frequency detector unit comprises:

a frequency conversion unit configured to convert the variable frequency signal into a digital signal which mean value represents the frequency of the variable frequency signal and a signal combination unit configured to combine the reference frequency signal $f_{ref}$ and the digital signal to obtain the frequency difference signal.

In a further embodiment, the frequency detector unit further comprises a low frequency gain unit configured to receive the frequency difference signal generated by the signal combination unit and to amplify any signal components below a predetermined frequency so as to obtain the frequency difference output signal.

In an embodiment of the invention, the low frequency gain unit comprises an input to receive the intermediate frequency difference signal;

an integrator unit to perform an integrator function on the intermediate difference signal and to provide an integrated signal;

a multiplication unit configured to multiply the integrated signal with a predetermined value to obtain a multiplied signal;

a signal combination unit configured to combine intermediate frequency difference signal and the multiplied signal to obtain the frequency difference output signal.

The low-frequency gain unit has the advantage that the loop of the FLL will have a step-response corresponding to a PLL. The multiplication factor performed by the multiplication unit determines the cut-off frequency of the filter characteristic of the low frequency gain unit, i.e. the point in the filter response where the amplification by the low-frequency gain unit becomes equal to the unity gain.

In an embodiment of the invention, the frequency conversion unit is configured to generate for each zero-crossing in the variable frequency signal a pulse with a fixed length. This a very efficient circuit to convert a signal with a certain frequency into a signal with a mean value corresponding to said frequency. As the loop filter has an improved attenuation of out-of-band frequencies, at the output of the loop filter the pulsed signal from the frequency conversion unit is averaged over time.

In an embodiment of the invention, the transceiver comprises a control unit configured to generate a control signal to instruct the integrator unit to switch between a first mode and a second mode, in the first mode the integrator unit is configured to integrate the difference signal and in the second mode the integrator unit is configured to freeze the integration.

These features enable the transceiver to have a mode with a short settling time and a mode with characteristic close to that of a PLL.

In an embodiment of the invention, the digital-to-analog convertor is a delta-sigma modulator.

The low-power characteristic of the FFL according to the invention enables designers to use the invention in low-power digital radios, such as IEEE 802.15.4 transceivers or ZigBee devices.

It will be clear that the various aspects mentioned in this patent application may be combined and may each be considered separately for a divisional patent application. Other features and advantages of the invention will become apparent from the following detailed description, taken in conjunction with the accompanying drawings which illustrate, by way of example, various features of preferred embodiments of the invention.

BRIEF DESCRIPTION OF THE FIGURES

These and other aspects, properties and advantages of the invention will be explained hereinafter based on the following description with reference to the drawings, wherein like reference numerals denote like or comparable parts, and in which.

DESCRIPTION OF EMBODIMENTS

Figure 1:
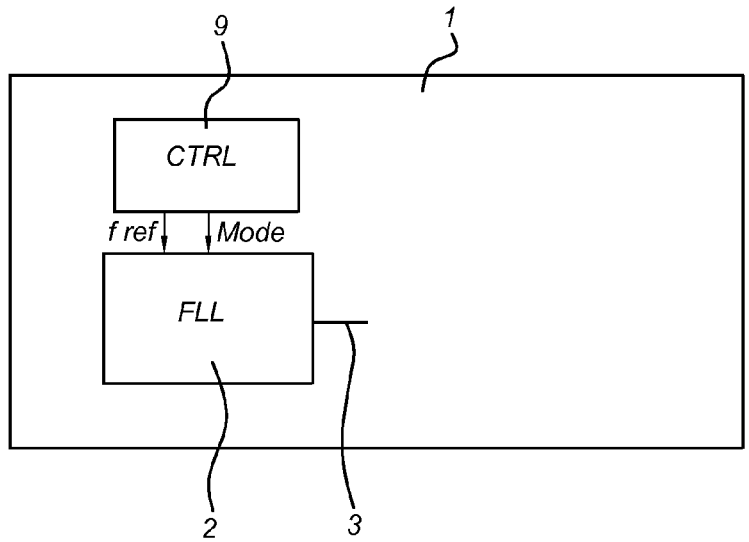
FIG. 1 shows a block diagram of a transceiver according to the invention.

FIG. 1 shows a block diagram of a transceiver according to the invention. The transceiver 1 comprises a sub-sampling based FLL 2 configured to generate an output signal 3 for use as a carrier signal for transmission and/or a signal with channel frequency for reception and a control unit 9. The control unit 9 is configured to generate control signals to be supplied to the FLL 2. The control signals could be mode signals to set the mode of the FLL and other predetermined parameters to set the FLL, for example a parameter $f_{ref}$ representing a reference frequency signal associated with the desired carrier frequency at the output 3 of the FLL 2. According to the invention and the following description the term "sub-sampling based" means that the output signal 3 of the frequency synthesizer having a frequency $f_{out}$ is sampled with a sampling unit with a sampling frequency $f_{sampling}$ to obtain a time discrete signal, wherein $f_{sampling} \ll f_{out}$. By sub-sampling or under-sampling the frequency $f_{out}$ is mapped to a frequency in the range from $-f_{sampling}/2$ to $+f_{sampling}/2$. By sub-sampling, the power consuming frequency division unit or counters counting the zero crossings or cycles in the output signal of the frequency synthesizer are replaced with a sampler which consumes considerably less energy. For an IEEE 802.15.4 transceiver $f_{out}$ has a frequency in the range of the 2.4 GHz band. In an embodiment a sampling frequency of 16 MHz is used.

Figure 2:
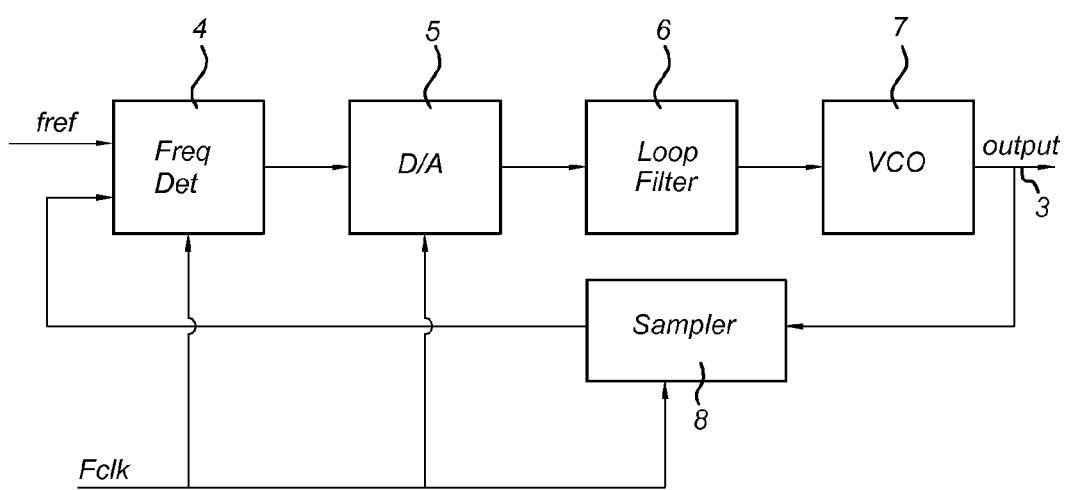
FIG. 2 shows a block diagram of a FLL according to the invention.

FIG. 2 shows a block diagram of an FLL 2 according to the invention. The FLL comprises a feedback loop with the following components: a frequency detection unit 4, a digital-to-analog convertor 5, a loop filter unit 6, a voltage controlled oscillator unit 7 and a sampling unit 8. The frequency detector unit 4 comprise a first input for receiving a reference frequency signal $f_{ref}$ and a second input for receiving a variable frequency signal. The frequency detector unit 4 is configured to generate a frequency difference output signal which is a function of a difference between a frequency value associated with the reference frequency signal $f_{ref}$ and a frequency value associated with the variable frequency signal. The frequency difference output signal is an error signal indicating the frequency offset of the sub-sampled output signal of the frequency synthesizer from the desired reference frequency indicated by the signal $f_{ref}$. The digital-to-analog convertor 5 is configured to convert the frequency difference signal in to an analog frequency difference signal. In an embodiment the digital-to-analog convertor 5 comprises a Delta Sigma Modulator (DSM) to convert the frequency difference output signal, which is a signal in the digital domain, in to an analog frequency difference signal. The analog-to-digital convertor is in an embodiment arranged to convert digital signal received at its input into a current at its output. In this embodiment de DSM comprises a charge pump so that a charge can be pumped into the loop filter unit 6.

The loop filter unit 6 is configured to receive the analog frequency difference output signal to provide a smoothed control signal. The loop filter unit 6 comprises electronic components such as resistors, capacitors and is configured to attenuate any signal component above a predetermined frequency. In this way, the loop filter 'averages' the analog frequency difference signal by removing high frequency components and feeds the result to the control input of the voltage controlled oscillator (VCO) unit 7. Signal components with a frequency higher than the loop filter cut-off frequency which are provided to the control input of the VCO unit 7 will be treated as frequency noise components at the output of the VCO unit 7. According to the present invention the loop filter unit 6 is preferably a $2^{nd}$ order loop filter with an out-of-band attenuation with a roll-off of 12 dB per octave.

The voltage controlled oscillator unit 7 configured to receive the smoothed control signal and to produce an output signal which frequency is a function of the smoothed control signal.

The output signal of the VCO unit 7 is supplied to sampling unit 8. The sampling unit 8 is configured to under-sample the output signal with a predetermined sampling frequency $f_{sampling}$ to obtain the variable frequency signal that is applied to the frequency detector unit 4, wherein the variable frequency signal is a P-bit digital signal, P being a positive integer smaller than 8. In the following description P=1. In said case the sampling unit 8 is a binary sampler and the variable frequency signal is a binary signal with a frequency that can be calculated with the following formula: $f_{bs} = f_{VCO} - f_{sample} \times \text{round}(f_{VCO}/f_{sample})$, where $f_{bs}$ is frequency of binary signal, $f_{VCO}$ is frequency of output signal and round(x) rounds x to the nearest integer value.

Figure 3:
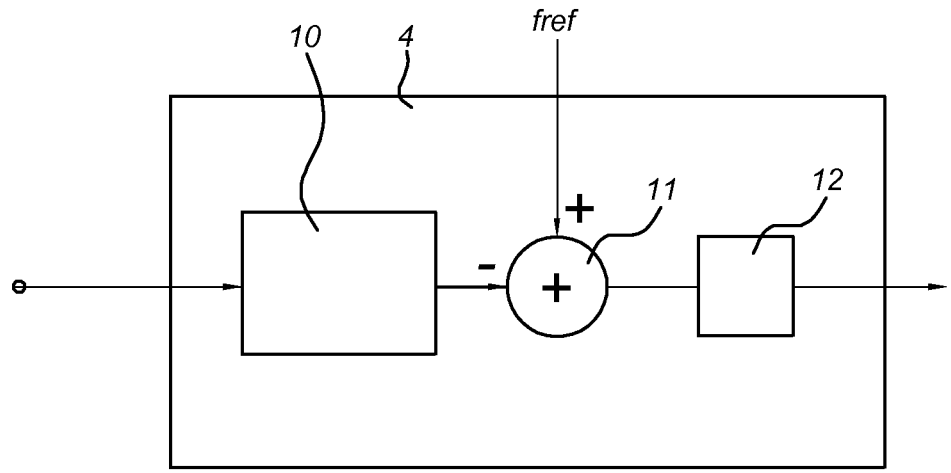
FIG. 3 shows a block diagram of an embodiment of a frequency detection unit according to the invention.

FIG. 3 shows a block diagram of an embodiment of a frequency detection unit 4. The frequency detection unit comprises a frequency conversion unit 10, a signal combination unit 11 and a low frequency gain unit 12. The frequency conversion unit 10 is configured to convert the variable frequency signal into a digital signal which value represents the frequency of the variable frequency signal. In an embodiment the frequency conversion unit is a one-shot circuit or monostable circuit, commonly known to the person skilled in the art. By means of the conversion unit, each edge of the 1-bit signal out of the samples and supplied to the input of the frequency detection unit 4 results in a positive pulse with a fixed length of a single sample period in the output signal of the frequency conversion unit 10. The mean value of the output signal of the frequency conversion unit 10 depends on the average frequency of the variable frequency signal. The output of the frequency conversion unit 10 is a representation of the down sampled frequency of the VCO output 3.

The signal combination unit 11 is arranged to combine the output signal of the frequency conversion unit 10 and parameter $f_{ref}$. Parameter $f_{ref}$ is in this implementation a constant value which is associated with the desired frequency at the output of the VCO 7. Each frequency at the output of the VCO 7 has an associated value. The reference frequency signal $f_{ref}$ is an adjustable constant M-bit value, wherein the constant M-bit value determines the average frequency of the output signal of the frequency synthesizer Therefore, to enable the frequency synthesizer to tune at for example the desired 16 channel frequencies of IEEE 802.15.4, the controller comprises a memory not shown with 16 values, one value for each channel frequency. In FIG. 3, the signal combination unit 11 is a digital M-bit subtractor configured to subtract the M-bit output signal of the frequency conversion unit 10 from the constant parameter $f_{ref}$ to obtain an intermediate frequency difference signal which average value is an indication of a frequency difference between the desired frequency and the frequency of the signal at the output of the VCO 7. The intermediate frequency difference signal is an M+1 bit signal which is supplied to the low frequency gain unit 12.

It is clear to the person skilled in the art that if the frequency conversion unit 10 supplies a signal with negative pulse, the signal combination unit 11 could be an adder in stead of a subtractor to provide the same functionality.

Figure 4:
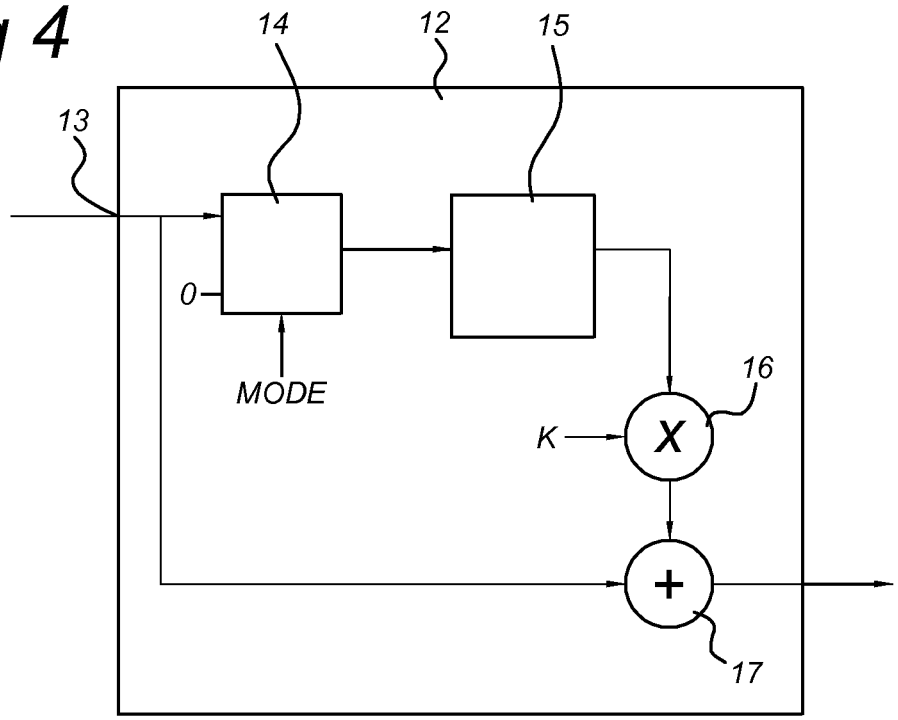
FIG. 4 shows a block diagram of a low frequency gain unit according to the invention.

FIG. 4 shows a block diagram of an embodiment of a low frequency gain unit 12 according to the invention. The low frequency gain unit 12 is configured to receive the intermediate frequency difference signal and to amplify any signal component below a predetermined frequency to obtain the frequency difference output signal. The low frequency gain unit 12 comprises an input 13 (not indicated in FIG. 4) to receive the intermediate frequency difference signal, an integrator unit 15 to perform an integrator function on the intermediate difference signal and to provide an integrated signal, a multiplication unit 16 configured to multiply the integrated signal with a predetermined value K to obtain a multiplied signal and a signal combination unit 17 configured to combine intermediate frequency difference signal and the multiplied signal to obtain the frequency difference output signal. In FIG. 4 the signal combination unit 17 is an adder, however depending on the implementation, i.e. characteristics, of the other units of the low frequency gain unit 12 the signal combination unit could be a subtractor. It should be noted that the integrator unit 15 has an internal register and circuitry with a word-width sufficient to perform an integration function in worst case situations without overflow/underflow, thus without truncation, wrap around or limiting. The multiplication unit 16 enables to control the frequency characteristic of the low frequency gain unit 12 with respect to the gain factor of the integration function and consequently the bandwidth of the frequencies which gain is higher then unit gain.

Optionally, the low frequency gain unit 12 comprises a multiplexer unit 14 provided between the input of the low frequency gain unit 12 and the input of the integrator unit 15. The multiplexer unit 14 comprises a first input coupled to the input of the low frequency gain unit 12, a second input coupled to a digital value "0" and an output coupled to the input of the integrator unit 15. The multiplexer unit 12 further comprises a control input for receiving a mode control signal MODE. The mode control signal MODE instructs multiplexer unit 14 to switch between a first mode and a second mode. In the first mode, the multiplexer unit 14 couples the first input to the output of the multiplexer unit 14 and supplies the signal received at the input of the low frequency gain unit 12 to the integrator unit 15. In the second mode, the multiplexer unit 14 supplies a digital value "0" to the integrator unit 15. In the first mode, the integration function of the low frequency gain unit 12 is active in the second mode the integration function is frozen, i.e. the output signal of the integration unit is kept constant. In the first mode the frequency synthesizer has a loop characteristic of a PLL and in the second mode the frequency synthesizer has a loop characteristic of a FLL.

Switching between the first mode en second mode enables us to improve the settling time of the output signal of the frequency synthesizer when switching from a first desired output frequency to a second desired output frequency. Freezing the integration function has the advantage that the settling time of the integration will be improved as the frozen integration value will be a good approximation of the integration value in settled loop condition when changing from second mode to first mode.

In an embodiment of the invention, the control unit 9 is configured to switch the low frequency gain unit 12 to the first mode at a predefined time after the low frequency gain unit have been switched in to the second mode.

FIGS. 5-8 are used to elucidate the characteristics of the FLL according to the invention in comparison to a PLL.

Figure 5:
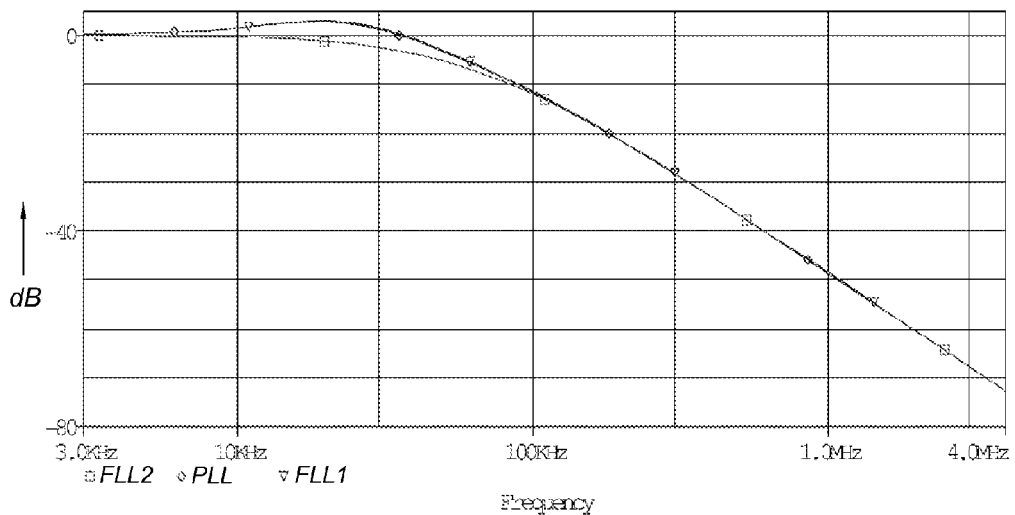
FIG. 5 illustrates the low-pass response of a PLL and the two modes of the FLL according to the invention.

FIG. 5 illustrates the low-pass response of a PLL and the two modes of the FLL according to the invention. The diagram shows on het horizontal axis the frequency and the vertical axis the amplitude in dB. The diagram comprises three curves corresponding to the closed loop low-pass response of the loop in a frequency synthesizer. The input signal is injected between the output of the loop filter unit and the input of the VCO. The curve indicated with PLL corresponds to the low-pass frequency response of a PLL-based frequency synthesizer. The curves indicated with FLL1, FLL2 correspond to the low-pas frequency response of the FLL-based frequency synthesizer according to the present invention with the low frequency gain unit 12 switched in the first mode and second mode respectively. It can be seen that with an FLL without integrator the closed loop low-pass response of the FLL differs in the range from 3 kHz to about 100 kHz from the response of a PLL. By applying the integration function, a response of the FLL can be obtained with approximates the response of a PLL.

Figure 6:
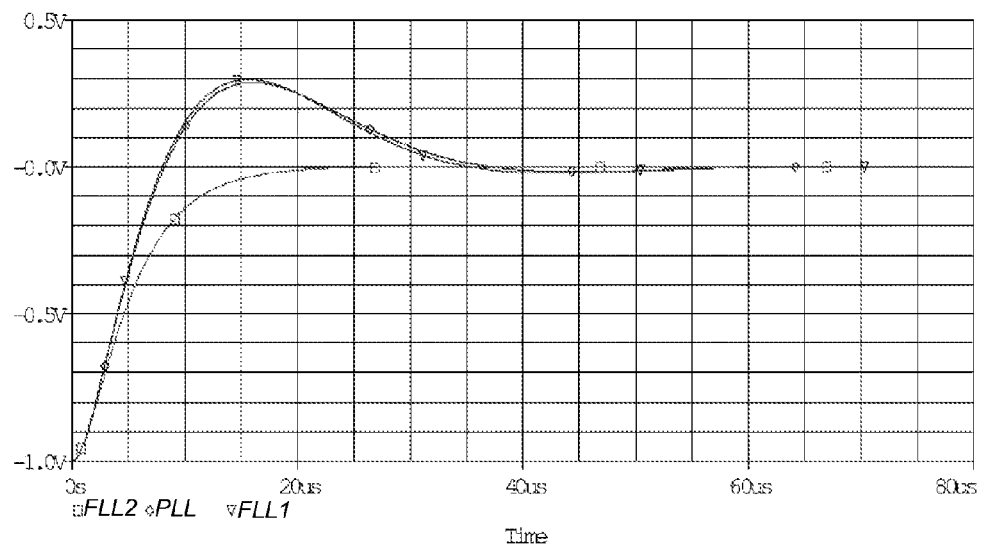
FIG. 6 illustrates the impulse response of a PLL and the two modes of the FLL according to the invention.

FIG. 6 illustrates the impulse response of a PLL and the two modes of the FLL according to the invention. It can be seen that the FLL switched in second mode FLL2, i.e. without integration function on, settles much faster 20 μs compared to a PLL and the FLL according to the invention in the first mode FLL1. This difference of settling behaviour of the FLL between the first mode and second mode is used to improve the settling time of the frequency synthesizer when changing the output frequency. When the frequency synthesizer has to change frequency, the frequency synthesizer is set in the second mode, i.e. integrator frozen. Then after about 20 μs, the time to settle the FLL in the second mode, the FLL is changed to the first mode FLL1. From now on, the FLL will have a loop behaviour like a PLL.

Figure 7:
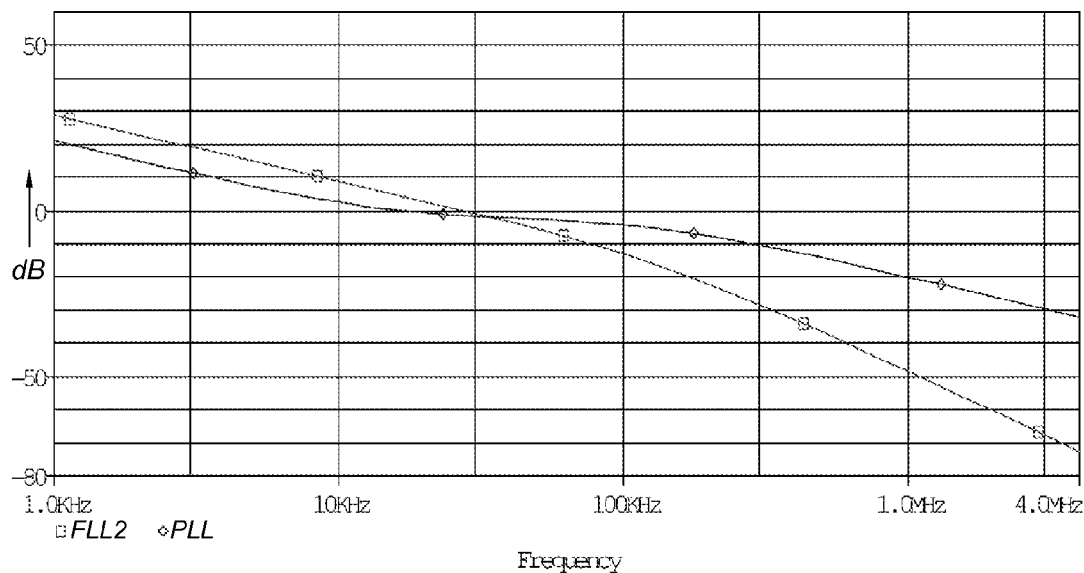
FIG. 7 illustrates the open loop response of a PLL and the second mode of the FLL according to the invention; and, FIG. 8 illustrates the open loop response of a PLL, the first mode of the FLL according to the invention and the frequency response of the low frequency gain unit in the first mode.

FIG. 7 illustrates an open loop response of a PLL and the second mode FLL2 of the FLL according to the invention from the input of the frequency detector to the input of the VCO. It can clearly be seen that the loop filter unit 6 with an out-of-band attenuation with a roll-off of −12 dB in the FLL according to the invention suppresses much better high frequency components at the input of the detector. This allows us to use a sampler without significant degradation of the quality of the output signal of the frequency synthesizer, i.e. frequency or phase noise in the output signal. This makes it possible to use a sub-sampling based frequency locked loop frequency synthesizer as a frequency synthesizer in a transmitter/receiver to generate an output signal for use as a carrier signal with a channel frequency for transmission and/or a signal with channel frequency for reception.

Figure 8:
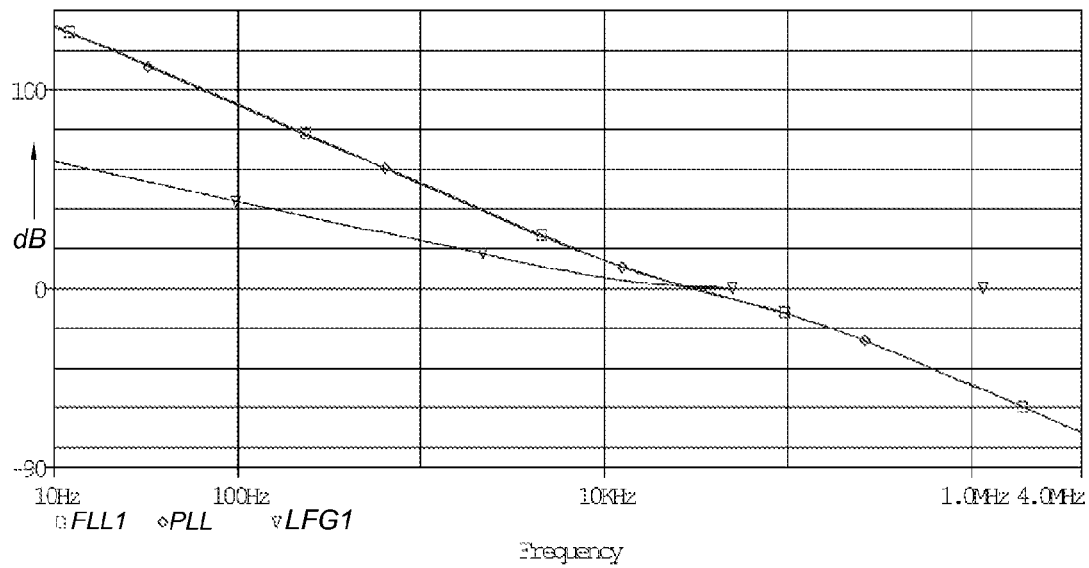

FIG. 8 illustrates an open loop response from the VCO input to the output of the loop filter of a PLL, the first mode of the FLL according to the invention FLL1 and the frequency response of the low frequency gain unit in the first mode LFG1. The gain at both low frequencies and high frequencies of the FLL in first mode FLL1 is comparable with a PLL. In the second mode the FLL according to the invention has an open loop response from the VCO input to the output of the loop filter which has a lower gain for low frequencies. In the given example low frequencies are frequencies below 20 kHz. The curve of the FLL in second mode can be obtained by subtracting the gain of the low frequency gain unit LFG1 from curve indicated by FLL1. Therefore, the FLL according to the invention in the second mode, i.e. without integration function, suppresses the VCO low frequency phase noise not so good as a PLL. However, the VCO low frequency noise is not critical during the settling time of a frequency synthesizer. By changing from the second mode to the first mode the FLL will have a gain at low frequencies which is comparable to a gain at low frequencies of a PLL.

The present invention providing a combination of an FLL and sub-sampling allows to obtain a sub-sampling based locked loop with a closed loop response similar to a PLL but having improved settling time and improved suppression of high frequency components of the quantization noise due to the sampling process. The invention allows to obtain a frequency synthesizer with improved characteristics with respect to at least one of power consumption, locking characteristic, design optimization characteristics compared to non-sub-sampling PLL based frequency synthesizers.

The measures described hereinbefore for embodying the invention can obviously be carried out separately or in parallel or in a different combination or if appropriate be supplemented with further measures; it will in this case be desirable for the implementation to depend on the field of application of the transceiver. The invention is not limited to the illustrated embodiments. Changes can be made without departing from the idea of the invention. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A transceiver comprising a frequency synthesizer configured to generate an output signal for use as a carrier signal for transmission and/or a signal with the channel frequency for reception, characterized in that, the frequency synthesizer is a sub-sampling based frequency locked loop frequency synthesizer at which the frequency synthesizer output signal with a frequency $f_{out}$ is directly sampled with sampling frequency $f_{sampling}$ wherein $f_{sampling} \ll f_{out}$,
wherein the frequency locked loop frequency synthesizer comprises:
a frequency detector unit configured to receive a reference frequency signal $f_{ref}$ and a variable frequency signal and to generate a frequency difference output signal, the difference output signal being a function of a difference between a frequency value associated with the reference frequency signal $f_{ref}$ and a frequency value associated with the variable frequency signal;
a digital-to-analog convertor configured to convert the frequency difference output signal into an analog frequency difference signal;
a loop filter unit configured to receive the analog frequency difference output signal and configured to attenuate any signal component above a predetermined frequency to provide a smoothed control signal;
a voltage controlled oscillator unit configured to receive the smoothed control signal and to produce an output signal which frequency is a function of the smoothed control signal; and
a sampling unit configured to under-sample the output signal with a predetermined sampling frequency $f_{sampling}$ to obtain the variable frequency signal that is applied to the frequency detector unit, wherein the variable frequency signal is a P-bit digital signal, P being a positive integer smaller than 8.

2. The transceiver of claim 1, wherein P=1.

3. The transceiver of claim 1, wherein the reference frequency signal $f_{ref}$ is an adjustable constant M-bit value, wherein the constant M-bit value determines the average frequency of the output signal of the frequency synthesizer, and wherein the frequency detector unit comprises:
a frequency conversion unit configured to convert the variable frequency signal into a digital signal which value represents the frequency of the variable frequency signal and
a signal combination unit configured to combine the reference frequency signal $f_{ref}$ and the digital signal to obtain the frequency difference signal.

4. The transceiver of claim 3, wherein the frequency conversion unit is configured to generate for each zero-crossing in the variable frequency signal a pulse with a fixed length.

5. The transceiver of claim 1, wherein the reference frequency signal is an adjustable constant M-bit value, wherein the constant M-bit value determines the average frequency of the output signal of the frequency synthesizer, and wherein the frequency detector unit comprises:
a frequency conversion unit configured to convert the variable frequency signal into a digital signal with an average value that represents the frequency of the variable frequency signal;
a signal combination unit configured to combine the reference frequency signal $f_{ref}$ and the digital signal to obtain an intermediate frequency difference signal; and
a low frequency gain unit configured to receive the intermediate frequency difference signal and to amplify signal components below of a predetermined frequency to obtain the frequency difference output signal.

6. The transceiver of claim 5, wherein the low frequency gain unit comprises
an input to receive the intermediate frequency difference signal;
an integrator unit to perform an integrator function on the intermediate difference signal and to provide an integrated signal;
a multiplication unit configured to multiply the integrated signal with a predetermined value to obtain a multiplied signal;
a signal combination unit configured to combine intermediate frequency difference signal and the multiplied signal to obtain the frequency difference output signal.

7. The transceiver of claim 6, wherein the transceiver further comprises a control unit configured to generate a mode control signal to instruct the low frequency gain unit to switch between a first mode and a second mode, in the first mode the low frequency gain unit is configured to perform an integration function on the intermediate difference signal and in the second mode the low frequency gain unit is configured to freeze the integration function.

8. The transceiver of claim 7, wherein the control unit is configured to switch the low frequency gain unit to the first mode at a predefined time after the low frequency gain unit have been switched in to the second mode.

9. The transceiver of claim 1, wherein the digital-to-analog convertor is a delta-sigma modulator.

10. The transceiver of claim 1, wherein the transceiver is an IEEE 802.15.4 transceiver.

11. Frequency synthesizer having a frequency locked loop synthesizer wherein the frequency locked loop frequency synthesizer comprises:
- a frequency detector unit configured to receive a reference frequency signal $f_{ref}$ and a variable frequency signal and to generate a frequency difference output signal, the difference output signal being a function of a difference between a frequency value associated with the reference frequency signal $f_{ref}$ and a frequency value associated with the variable frequency signal;
- a digital-to-analog convertor configured to convert the frequency difference output signal into an analog frequency difference signal;
- a loop filter unit configured to receive the analog frequency difference output signal and configured to attenuate any signal component above a predetermined frequency to provide a smoothed control signal;
- a voltage controlled oscillator unit configured to receive the smoothed control signal and to produce an output signal which frequency is a function of the smoothed control signal; and
- a sampling unit configured to under-sample the output signal with a predetermined sampling frequency $f_{sampling}$ to obtain the variable frequency signal that is applied to the frequency detector unit, wherein the variable frequency signal is a P-bit digital signal, P being a positive integer smaller than 8.

12. The frequency synthesizer of claim 11, wherein P=1.

13. The frequency synthesizer of claim 11, wherein the reference frequency signal $f_{ref}$ is an adjustable constant M-bit value, wherein the constant M-bit value determines the average frequency of the output signal of the frequency synthesizer, and wherein the frequency detector unit comprises:
- a frequency conversion unit configured to convert the variable frequency signal into a digital signal which value represents the frequency of the variable frequency signal and
- a signal combination unit configured to combine the reference frequency signal $f_{ref}$ and the digital signal to obtain the frequency difference signal.

14. The frequency synthesizer of claim 13, wherein the frequency conversion unit is configured to generate for each zero-crossing in the variable frequency signal a pulse with a fixed length.

15. The frequency synthesizer of claim 11, wherein the reference frequency signal is an adjustable constant M-bit value, wherein the constant M-bit value determines the average frequency of the output signal of the frequency synthesizer, and wherein the frequency detector unit comprises:
- a frequency conversion unit configured to convert the variable frequency signal into a digital signal with an average value that represents the frequency of the variable frequency signal;
- a signal combination unit configured to combine the reference frequency signal $f_{ref}$ and the digital signal to obtain an intermediate frequency difference signal; and
- a low frequency gain unit configured to receive the intermediate frequency difference signal and to amplify signal components below of a predetermined frequency to obtain the frequency difference output signal.

16. The frequency synthesizer of claim 15, wherein the low frequency gain unit comprises
- an input to receive the intermediate frequency difference signal;
- an integrator unit to perform an integrator function on the intermediate difference signal and to provide an integrated signal;
- a multiplication unit configured to multiply the integrated signal with a predetermined value to obtain a multiplied signal;
- a signal combination unit configured to combine intermediate frequency difference signal and the multiplied signal to obtain the frequency difference output signal.

17. The frequency synthesizer of claim 16, wherein the frequency synthesizer further comprises a control unit configured to generate a mode control signal to instruct the low frequency gain unit to switch between a first mode and a second mode, in the first mode the low frequency gain unit is configured to perform an integration function on the intermediate difference signal and in the second mode the low frequency gain unit is configured to freeze the integration function.

18. The frequency synthesizer of claim 17, wherein the control unit is configured to switch the low frequency gain unit to the first mode at a predefined time after the low frequency gain unit have been switched in to the second mode.

19. The frequency synthesizer of claim 11, wherein the digital-to-analog convertor is a delta-sigma modulator.

* * * * *